(12) United States Patent
Kwon et al.

(10) Patent No.: US 8,460,469 B2
(45) Date of Patent: Jun. 11, 2013

(54) APPARATUS FOR ETCHING SUBSTRATE AND METHOD OF ETCHING SUBSTRATE USING THE SAME

(75) Inventors: Gi-Chung Kwon, Gyeonggi-do (KR); Joung-Sik Kim, Gyeonggi-do (KR); Jin Hong, Gyeonggi-do (KR)

(73) Assignee: Jusung Engineering Co., Ltd (KR)

( * ) Notice: Subject to any disclaimer, the term of this patent is extended or adjusted under 35 U.S.C. 154(b) by 587 days.

(21) Appl. No.: 12/395,702

(22) Filed: Mar. 1, 2009

(65) Prior Publication Data

US 2009/0223930 A1    Sep. 10, 2009

(30) Foreign Application Priority Data

Mar. 6, 2008   (KR) .............................. 2008-0021069

(51) Int. Cl.
| | | |
|---|---|---|
| C23C 16/00 | (2006.01) | |
| C23F 1/00 | (2006.01) | |
| H01L 21/306 | (2006.01) | |

(52) U.S. Cl.
USPC ....................................... 118/721; 156/345.3

(58) Field of Classification Search
USPC ................................ 118/720, 721; 156/345.3
See application file for complete search history.

(56) References Cited

U.S. PATENT DOCUMENTS

| | | | |
|---|---|---|---|
| 6,872,259 B2 * | 3/2005 | Strang | 118/715 |
| 2003/0019580 A1 * | 1/2003 | Strang | 156/345.33 |
| 2003/0089314 A1 * | 5/2003 | Matsuki et al. | 118/715 |
| 2005/0173067 A1 * | 8/2005 | Lim | 156/345.32 |

FOREIGN PATENT DOCUMENTS

| | | |
|---|---|---|
| DE | 69519008 | 3/2001 |
| JP | 03188627 | 8/1991 |
| JP | 2000-186000 | 7/2000 |
| JP | 2005-142529 | 6/2005 |
| WO | 2007148897 | 12/2007 |

* cited by examiner

*Primary Examiner* — Maureen Gramaglia
(74) *Attorney, Agent, or Firm* — Renaissance IP Law Group LLP

(57) ABSTRACT

An apparatus for etching a substrate includes: a chamber; a susceptor in the chamber, the susceptor including at least one loading portion corresponding to at least one substrate; a gas supply over the susceptor, the gas supply including a hollow and at least one through hole corresponding to the at least one loading portions; and at least one shielding means interposed into the at least one through holes, the at least one shielding means including a body part and a hanging part on the body part, the body part having a cross-sectional area smaller than the at least one through holes, and the hanging part outwardly protruding from the body part, wherein the at least one shielding means is suspended on the gas supply by the hanging part, and wherein the body part shields a central portion of the at least one substrate and exposes an edge portion of the at least one substrate.

16 Claims, 18 Drawing Sheets

APPARATUS FOR ETCHING SUBSTRATE AND METHOD OF ETCHING SUBSTRATE USING THE SAME

This application claims the benefit of Korean Patent Application No. 2008-0021069, filed on Mar. 6, 2008, which is hereby incorporated by a reference in its entirety.

TECHNICAL FIELD

The present invention relates to an apparatus for etching a substrate, and more particularly, to an apparatus for etching an edge portion of a substrate and a method of etching an edge portion of a substrate.

BACKGROUND

A solar cell is a device that generates an electromotive force due to minor carriers excited in a positive negative (PN) junction of a semiconductor material by light. Single crystalline silicon, polycrystalline silicon, amorphous silicon or compound semiconductor is used for a solar cell. Although the single crystalline silicon has advantages in energy conversion efficiency, fabrication cost is relatively high. Accordingly, the polycrystalline silicon has been widely used for a solar cell. Recently, a thin film type solar cell including a thin film of amorphous silicon or compound silicon on a substrate of glass or plastic has been suggested.

FIG. 1 is a flow chart showing a method of fabricating a solar cell of crystalline silicon according to the related art, and FIGS. 2A to 2E are cross-sectional views showing a method of fabricating a solar cell of crystalline silicon according to the related art.

At step st11 of FIG. 1 and in FIG. 2A, defects of a positive (P) type substrate 10 generated in a cutting process are removed by a wet etching method using an alkaline solution or an acid solution.

At step st12 of FIG. 1, the substrate 10 is textured for increasing light absorption rate. During the texturing step, minute uneven portions are formed on a surface of the substrate 10. For example, the minute uneven portions may have a pyramid shape. In addition, the texturing step may be performed through a wet etching method using an alkaline solution or an acid solution, or through a dry etching method using a plasma.

At step st13 of FIG. 1 and in FIG. 2B, negative (N) type dopants are diffused in the P type substrate 10 to form a positive negative (PN) junction. For example, a thermal diffusion method may be used for forming the PN unction. A gas including N type dopants such as phosphorus chloride oxide ($POCl_3$) or phosphine ($PH_3$) is supplied to a furnace having the substrate 10 and the N type dopants are diffused into the substrate 10 to form an n+ doped layer 12 on a surface of the substrate 10.

Since the thermal diffusion step is performed at a temperature higher than about 800° C., a by-product such as phosphor silicate glass (PSG) is formed on the surface of the substrate 10 during the thermal diffusion step. Since the PSG blocks a current flow in the solar cell, the PSG is removed at step st14 of FIG. 1 to increase the efficiency of the solar cell. When P type dopants such as boron (B) are used for an N type substrate, a by-product such as boro silicate glass (BSG) is formed on the surface of the substrate. Since the BSG also blocks a current flow in the solar cell, the BSG should be removed.

At step st15 of FIG. 1 and in FIG. 2C, the n+ doped layer 12 in edge portions of the substrate 10 is removed. In the thermal diffusion step, the n+ doped layer 12 is formed in the edge portion of the substrate 10. Since a leakage current between front and rear electrodes is generated through the n+ doped layer 12 in the edge portion, the n+ doped layer 12 in the edge portion of the substrate 10 is removed through an edge isolation step. For example, the n+ doped layer 12 in the edge portion may be cut by a laser. Alternatively, the n+ doped layer 12 in the edge portion may be removed through a wet etching method. In addition, the edge isolation step may be performed before the PSG is removed. Furthermore, the edge isolation may be performed after the solar cell is completed and before the solar cell is tested.

At step st16 of FIG. 1 and in FIG. 2D, an antireflection layer 14 is formed on the n+ doped layer 12. For example, the antireflection layer 14 of silicon nitride (SiN) may be formed through a plasma enhanced chemical vapor deposition (PECVD) method or a sputtering method. The antireflection layer 14 may increase a light absorption rate of the solar cell. In addition, the antireflection layer 14 may protect the surface of the substrate 10 as a surface passivation layer or a hydrogen passivation layer.

At step st17 of FIG. 1 and in FIG. 2E, a conductive paste including aluminum (Al) or silver (Ag) is coated on the front and rear surfaces of the substrate 10 through a screen printing method, and the substrate 10 having the conductive paste is sintered in a furnace of high temperature to form front and rear electrodes 18 and 16 on front and rear surfaces, respectively, of the substrate 10. Specifically while the paste including aluminum (Al) over the rear surface of the P type substrate 10 is sintered aluminum (Al) is diffused into the n+ doped layer 12 on the rear surface of the substrate 10 to form a p+ doped layer 13. The P type substrate 10 and the p+ doped layer 13 form a back surface field in the rear surface of the substrate 10. Due to the back surface field, the electrons excited in the P type substrate 10 by the light are not extinguished at the rear electrode 16. Instead, the electrons move toward the front electrode 18 by the back surface field to contribute to a photoelectric current and improve the light efficiency of the solar cell.

At step st18 of FIG. 1, the solar cell is tested, classified and modularized. The efficiencies of the completed solar cells are tested and the solar cells are classified according to the result of the test. In addition, the solar cells are modularized to form a solar cell module. Before the completed solar cells are tested, the modularization step may be performed. In addition, a laser cutting step for insulation may be performed before the completed solar cells are tested. Further, the edge isolation step of removing the n+ doped layer 12 in the edge portion to prevent a leakage current may be performed before the completed solar cells are tested.

A wet etching method for the edge isolation step has an advantage such that a plurality of substrates are treated at the same time. However, the wet etching method has a disadvantage such that the etching solution causes environmental problems. Recently, a dry etching method using an apparatus for the edge isolation step has been suggested. Since a plurality of substrates are treated one by one in the dry etching method, the dry etching method according to the related art has a disadvantage in productivity. Specifically, since a deposition step of a thin film is performed for a plurality of substrates on a large-sized tray in a fabrication process of the solar cell, the dry etching method treating the plurality of substrates one by one becomes a bottleneck reducing productivity of the fabrication process of the solar cell. Further, since it is required to remove contaminants in edge portions of the substrate is applied to a fabrication process of a semiconductor device or a display device, the edge isolation step has been the subject of recent research and development.

SUMMARY

Accordingly, the present invention is directed to an apparatus for etching a substrate and a method of etching a substrate using the apparatus that substantially obviate one or more of the problems due to limitations and disadvantages of the related art.

An object of the present invention is to provide an apparatus for etching an edge portion of at least one substrate.

An apparatus for etching a substrate includes: a chamber; a susceptor in the chamber, the susceptor including at least one first loading portion corresponding to at least one substrate; a gas supply over the susceptor, the gas supply including a hollow and at least one through hole corresponding to the at least one first loading portion; and at least one shielding means interposed into the at least one through holes, the at least one shielding means including a body part and a hanging part on the body part, the body part having a cross-sectional area smaller than the at least one through holes, and the hanging part outwardly protruding from the body part, wherein the at least one shielding means is suspended on the gas supply by the hanging part, and wherein the body part shields a central portion of the at least one substrate and exposes an edge portion of the at least one substrate.

A method of etching a substrate includes: loading at least one substrate on at least one loading portion of a susceptor in a chamber; moving up the susceptor so that a shielding means over the susceptor shields a central portion of the at least one substrate and exposes an edge portion of the at least one substrate; and etching the edge portion of the at least one substrate by using reaction gases through a gas supply disposed over the susceptor.

A gas supplying apparatus for etching a substrate includes: a gas supply including a hollow and at least one through hole; and at least one shielding means interposed into the at least one through holes, the at least one shielding means including a body part and a hanging part on the body part, the body part having a cross-sectional area smaller than the at least one through holes, and the hanging part outwardly protruding from the body part, wherein the at least one shielding means is suspended on the gas supply by the hanging part.

BRIEF DESCRIPTION OF THE DRAWINGS

The accompanying drawings, which are included to provide a further understanding of the invention and are incorporated in and constitute a part of this specification, illustrate embodiments of the invention.

DETAILED DESCRIPTION OF THE PREFERRED EMBODIMENTS

Reference will now be made in detail to embodiments which are illustrated in the accompanying drawings. Wherever possible, similar reference numbers will be used to refer to the same or similar parts.

Figure 3:
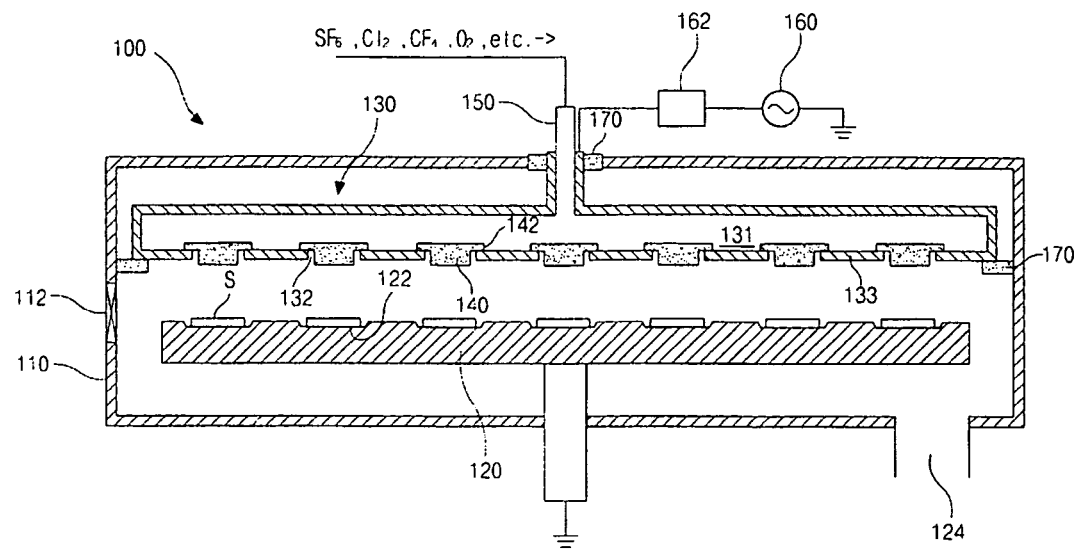
FIG. 3 is a cross-sectional view showing an apparatus for etching a substrate according to an embodiment of the present invention.
Figure 4:
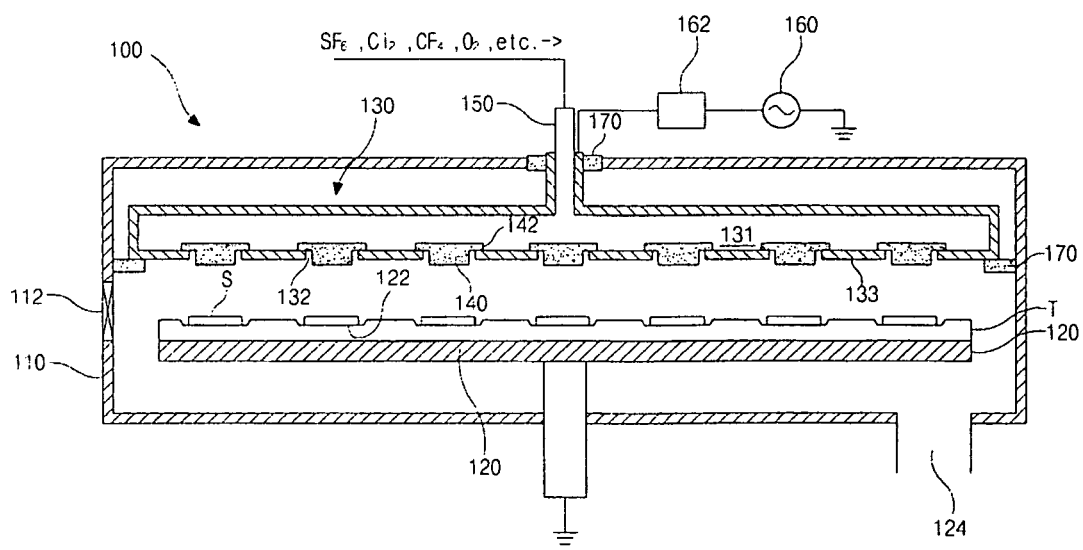
FIG. 4 is a cross-sectional view showing an apparatus for etching a substrate according to another embodiment of the present invention.

FIG. 3 is a cross-sectional view showing an apparatus for etching a substrate according to an embodiment of the present invention, and FIG. 4 is a cross-sectional view showing an apparatus for etching a substrate according to another embodiment of the present invention.

In FIG. 3, an apparatus 100 includes a chamber 110, a susceptor 120 and a radio frequency (RF) electrode 130. The chamber 110 includes a gateway 112 for inputting and outputting a plurality of substrates S. The plurality of substrates S are loaded on the susceptor 120 and the RF electrode 130 is disposed over the susceptor 120. The susceptor 120 includes a plurality of loading portions 122. Each loading portion 122 may be defined as a concave portion and a boundary of the concave portion may have a slant surface for alignment of each substrate S. Alternatively, each loading portion 122 may have the same surface as the other portions. In addition, the susceptor 120 moves up and down by a supporting means at a central portion of the susceptor 120. The susceptor 120 may be supported by a plurality of supporting means in another embodiment.

Several tens to several hundreds of substrates S are treated at the same time in a fabrication process for a solar cell.

Accordingly, as shown in FIG. 4, a tray T having a plurality of substrates S thereon is loaded on the susceptor 120. After the plurality of substrates S are disposed on the tray T, the tray T may be inputted into the chamber 110 and disposed on the susceptor 120. In addition, the susceptor 120 may have a flat top surface and the tray T may have a plurality of loading portions 122 for the plurality of substrates S.

The RF electrode 130 includes a conductive material such as aluminum (Al) and is connected to an RF power source 160 through a matching circuit 162 for impedance matching. The RF power source 160 supplies an RF power of about 10 kHz to about 13.56 MHz or an RF power of very high frequency (VHF) of about 30 MHz to about 300 MHz. The RF power supplied by the RF power source 160 may be determined according to a size of the susceptor 120.

The RF electrode 130 functions as a gas supply in the apparatus 100. Accordingly, the RF electrode 130 includes a hollow 131 connected to a gas inlet 150 and a plurality of through holes 132 in a bottom surface 133 thereof. In addition, an insulating means 170 is formed between the RF electrode 130 and a sidewall of the chamber 110 or between the RF electrode 130 and a lid of the chamber 110 to electrically insulate the RF electrode 130 from the chamber 110.

Figure 5:
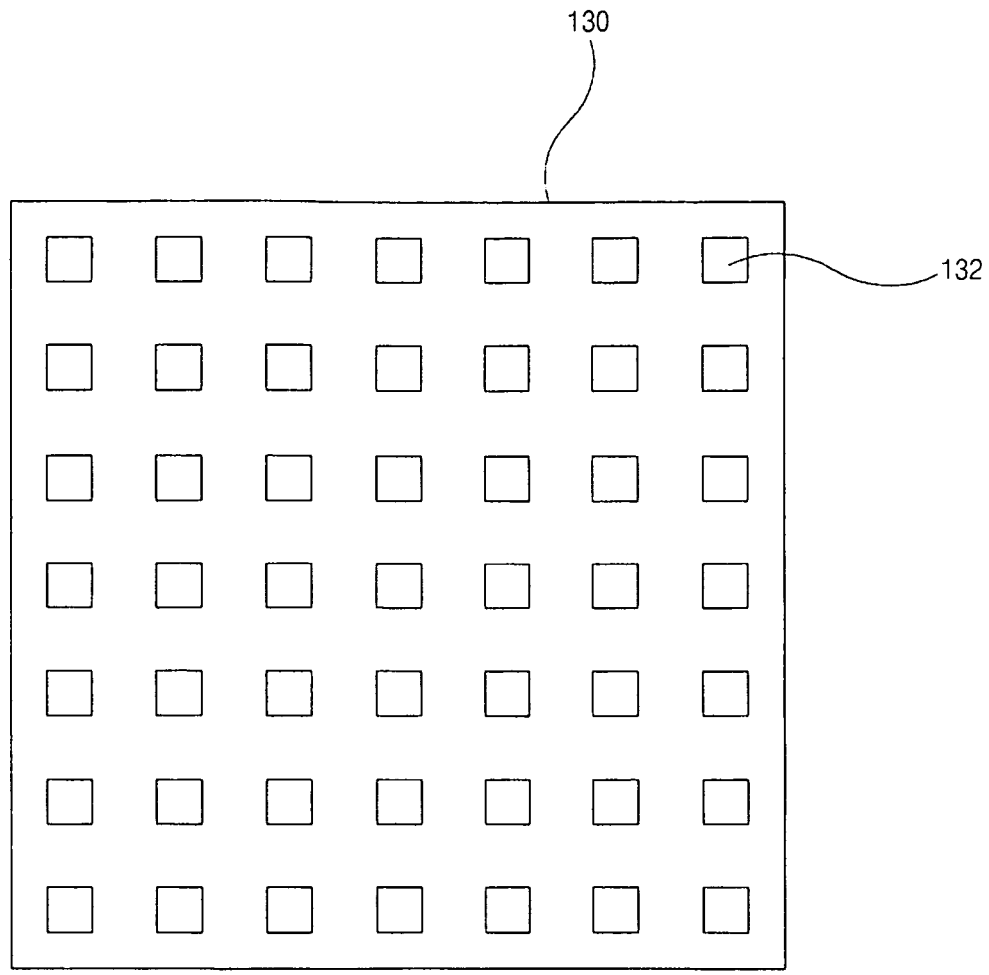
FIG. 5 is a plan view showing an RF electrode of an apparatus for etching a substrate of FIG. 3.

FIG. 5 is a plan view showing an RF electrode of an apparatus for etching a substrate of FIG. 3. As shown in FIG. 5, the plurality of through holes 132 of the RF electrode 130 correspond to the plurality of substrates S on the susceptor 120. A shielding means 140 is interposed into each through hole 132 to shield a central portion of each substrate S during the etching step.

Figure 6:
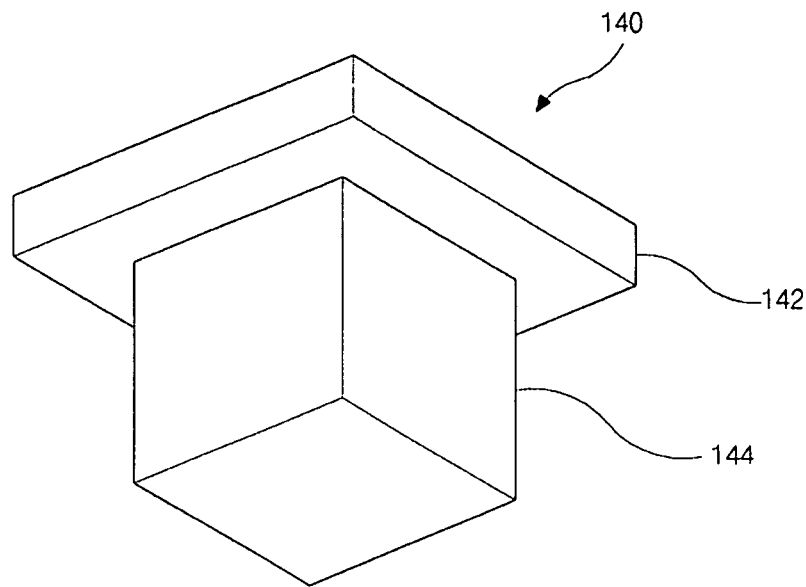
FIG. 6 is a perspective view showing a shielding means of an RF electrode of an apparatus for etching a substrate of FIG. 3.

FIG. 6 is a perspective view showing a shielding means of an RF electrode of an apparatus for etching a substrate of FIG. 3. As shown in FIG. 6, a shielding means 140 includes a body part 144 and a hanging part 142 on the body part 144. The shielding means 140 may include an insulating material such as ceramic, TEFLON, polyetheretherketone (PEEK), VESPEL and polymide. Since the hanging part 142 outwardly protrudes from the body part 144, the shielding means 140 is suspended on the bottom surface 133 of the RF electrode 130 through each through hole 132 by the hanging part 142. Accordingly, a cross-sectional area of the hanging part 142 is greater than an area of each through hole 132.

In addition, the body part 144 is downwardly protruded through each through hole 132. Since reaction gases in the hollow 131 of the RF electrode 130 flows through a gap between the body part 144 and the boundary of each through hole 132, a cross-sectional area of the body part 144 is smaller than the area of each through hole 132. Further, since the body part 144 shields the central portion of each substrate S, the cross-sectional area of the body part 144 is smaller than an area of each substrate S.

A cross-sectional shape of the body part 144 corresponds to a shape of each substrate S. Although the body part 144 has a rectangular cross-sectional shape because each substrate S has a rectangular shape in FIG. 6, the body part 144 may have a circular cross-sectional shape when each substrate has a circular shape. Accordingly, the cross-sectional shape and the cross-sectional area of the body part 144 are determined according to the shape and the area of each substrate S.

Referring again to FIG. 3, the shielding means 140 is aligned with each through hole 132 and each substrate S so that the shielding means 140 can shield the central portion of each substrate S and expose an edge portion of each substrate S with a uniform width. Since the cross-sectional area of the body part 144 is smaller than the area of each through hole 132, the body part 144 may have a unstable horizontal position while the susceptor 120 moves up and down.

Figure 7:
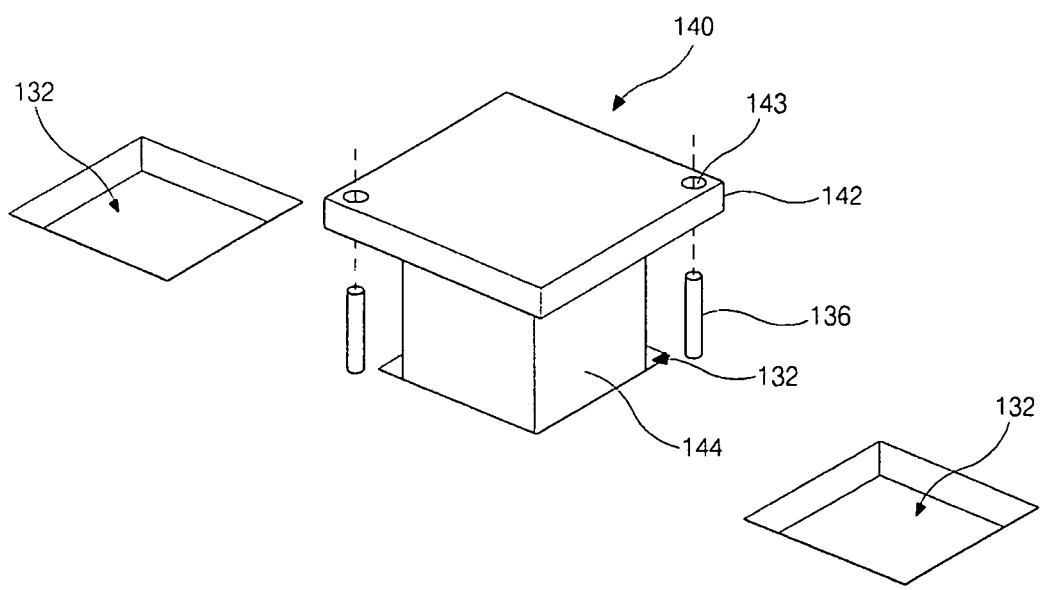
FIGS. 7 and 8 are perspective and cross-sectional views, respectively, showing a method of aligning a shielding means with a through hole in an apparatus for etching a substrate of FIG.
Figure 8:
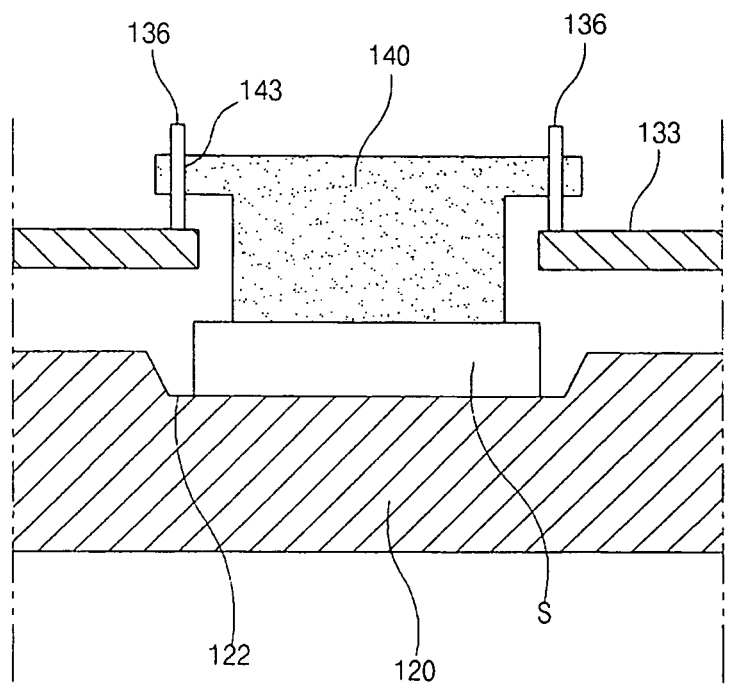

FIGS. 7 and 8 are perspective and cross-sectional views, respectively, showing a method of aligning a shielding means with a through hole in an apparatus for etching a substrate of FIG. 3. As shown in FIGS. 7 and 8, a plurality of alignment pins 136 are formed on the bottom surface 133 of the RF electrode 130 adjacent to each through hole 132, and a plurality of alignment holes 143 are formed in the hanging part 142 of the shielding means 140. The shielding means 140 is aligned with each through hole 132 by inserting the plurality of alignment pins 136 into the plurality of alignment holes 143, respectively. Since the shielding means 140 moves up and down along the plurality of alignment pins 136, an exact horizontal position of the shielding means 140 is kept even while the susceptor 120 moves up and down.

Figure 9:
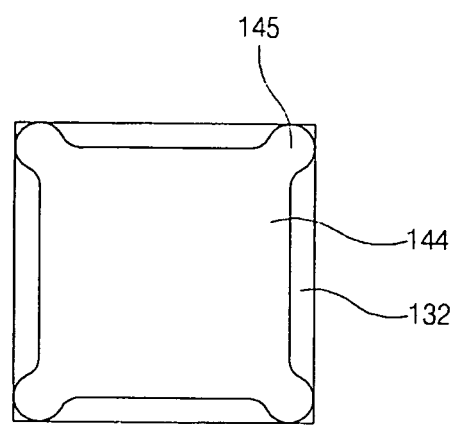
FIG. 9 is a plan view showing a method of aligning a shielding means with a through hole in an apparatus for etching a substrate according to another embodiment of the present invention.

FIG. 9 is a plan view showing a method of aligning a shielding means with a through hole in an apparatus for etching a substrate according to another embodiment of the present invention. As shown in FIG. 9, a plurality of alignment protrusions 145 are formed on a side surface of the body part 144 of the shielding means 140. Since the plurality of alignment protrusions 145 contact a sidewall of the through hole 132, a uniform gap distance between the body part 144 and the through hole 132 is kept even while the susceptor 120 and the body part 144 move up and down. For example, four alignment protrusions 145 may be formed on four corners of the body part 144 having a rectangular cross-sectional shape to contact four corners of the through hole 132. When the body portion has a circular cross-sectional shape, at least three alignment protrusions spaced part from each other by equidistance may be formed on the side surface of the body in another embodiment.

Figure 10:
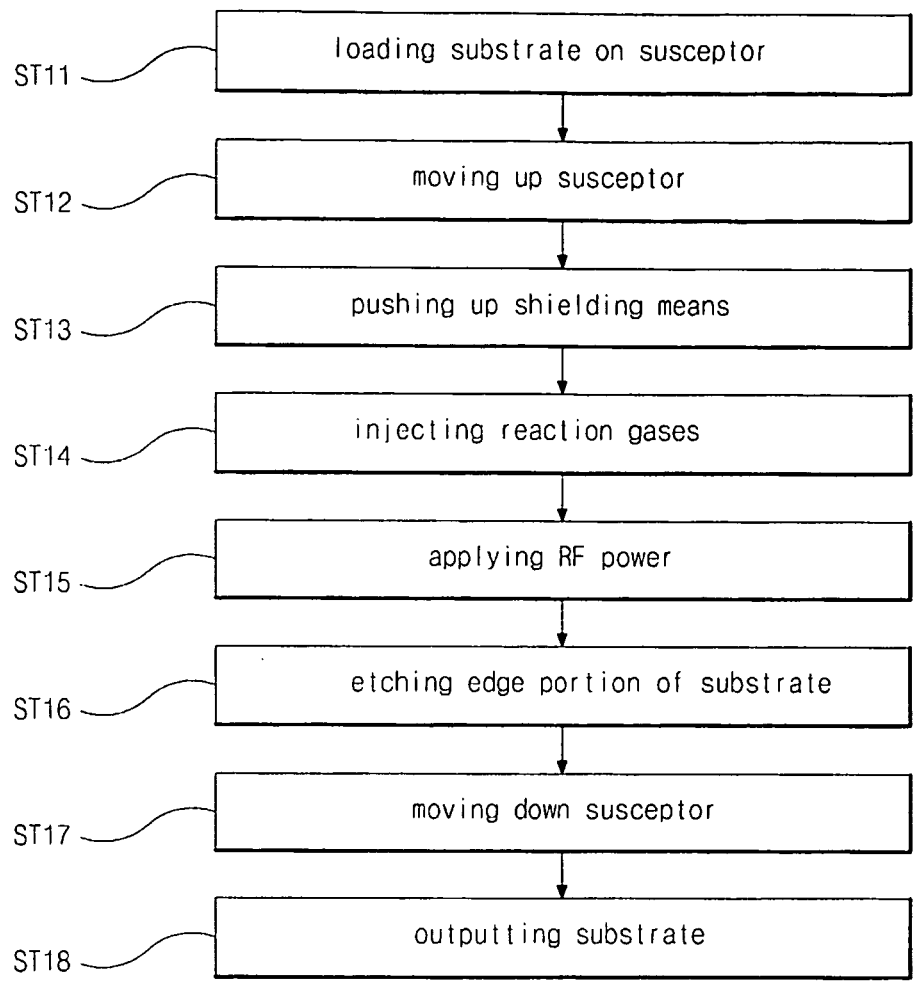
FIG. 10 is a flow chart showing a method of etching a substrate using an apparatus of FIG. 3.

FIG. 10 is a flow chart showing a method of etching a substrate using an apparatus of FIG. 3.

At step ST11 of FIG. 10, the plurality of substrates S are loaded in the plurality of loading portions 122 on the susceptor 120. When an apparatus of FIG. 4 is used for etching the substrate, the plurality of substrates S are loaded on the tray T outside the chamber 110. Next, the tray T having the plurality of substrates S thereon is inputted into the chamber 110 and is loaded on the susceptor 120.

At step ST12 of FIG. 10, after the gateway 112 is closed and a required process condition such as vacuum and temperature is obtained, the susceptor 120 moves up. In addition, at step ST13 of FIG. 10, the substrate S contacts and pushes up the shielding means 140 by upward movement of the susceptor 120 so that the hanging part 142 of the shielding means 140 can be separated from the bottom surface 133 of the RF electrode 130. The body part 144 of the shielding means 140 shields the central portion of the substrate S and exposes the edge portion of the substrate S. For example, the exposed edge portion of the substrate S may have a width within a range of about 0.1 mm to about 5 mm.

Figure 1:
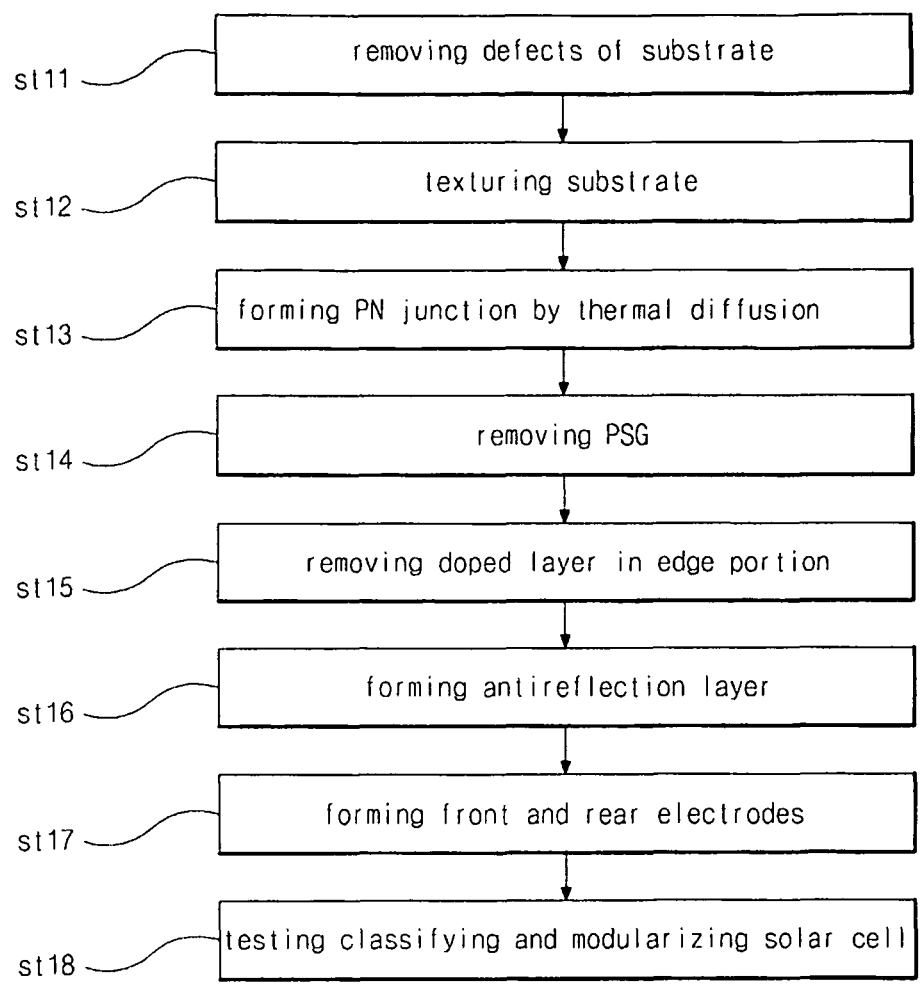
FIG. 1 is a flow chart showing a method of fabricating a solar cell of crystalline silicon according to the related art.
Figure 2A:
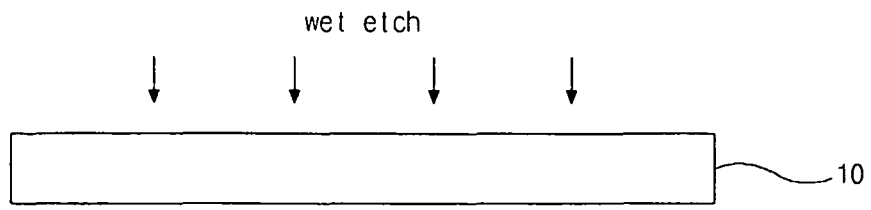
FIGS. 2A to 2E are cross-sectional views showing a method of fabricating a solar cell of crystalline silicon according to the related art.
Figure 2B:
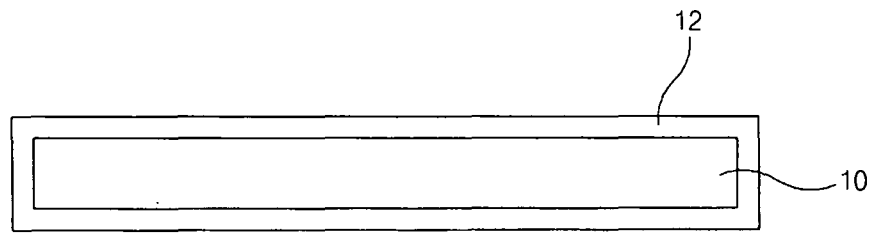
Figure 2C:
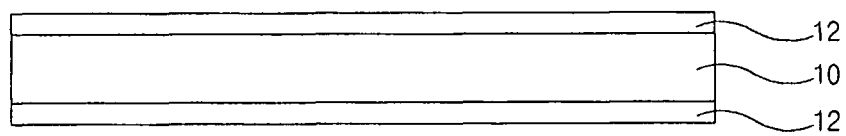
Figure 2D:
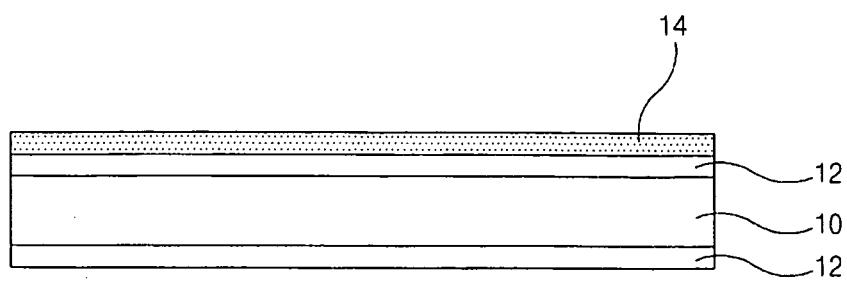
Figure 2E:
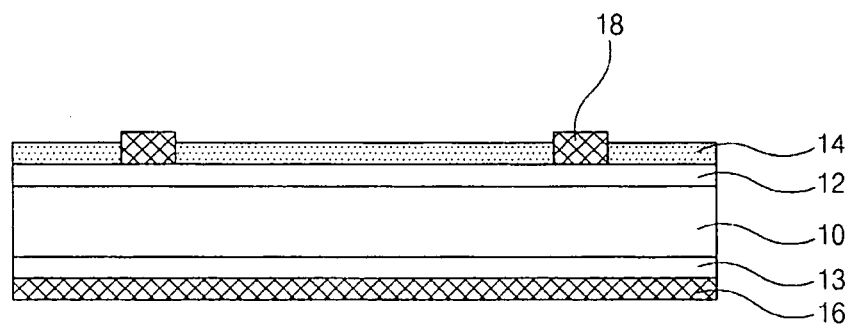
Figure 11:
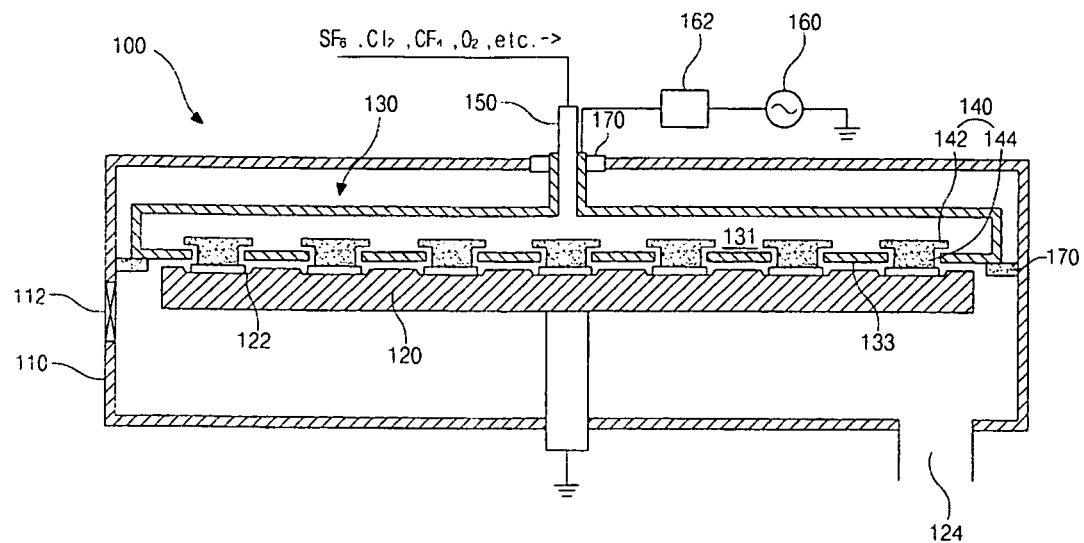
FIG. 11 is a cross-sectional view showing upper positions of a susceptor and a shielding means of an apparatus of FIG. 3.

FIG. 1 is a cross-sectional view showing upper positions of a susceptor and a shielding means of an apparatus of FIG. 3. As shown in FIG. 11 the susceptor 120 moves up and the substrate S on the susceptor 120 pushes up the shielding means 140. When the susceptor 120 is disposed at an uppermost position, a gap distance between the susceptor 120 and the RF electrode 130 is within a range of about 5 mm to about 50 mm.

At step ST14 of FIG. 10, the reaction gases such as sulfur hexafluoride ($SF_6$), chlorine ($Cl_2$), carbon tetrafluoride ($CF_4$) and oxygen ($O_2$) are supplied to the hollow 131 through the gas inlet 150 with a flow rate of about 10 sccm to about 100000 sccm. The reaction gases are diffused in the hollow 131 and injected over the substrate S through the gap between into the body part 144 and the boundary of the through hole 132 to etch the edge portion of the substrate S. The chamber 110 may have a pressure of about 10 mTorr to about 10 Torr during the etching step.

Figure 12:
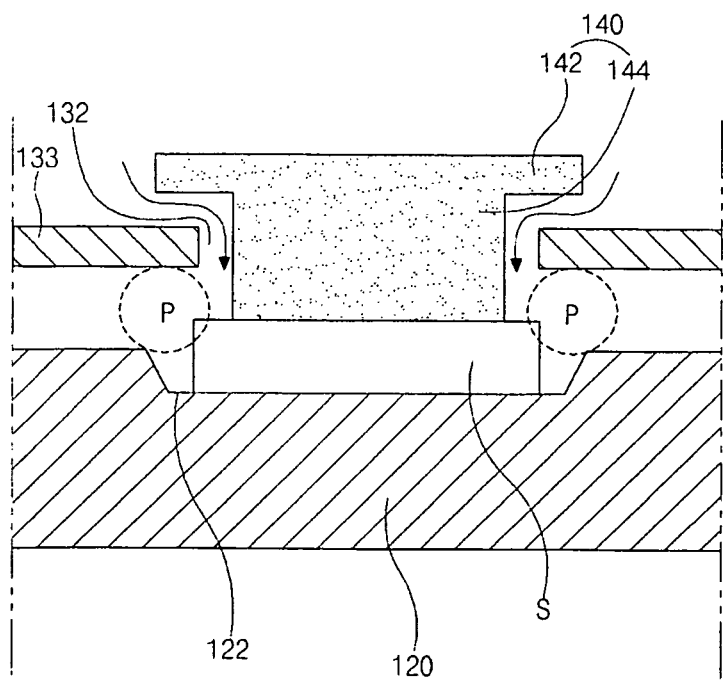
FIG. 12 is a cross-sectional view showing an injection path of reaction gases in an apparatus of FIG. 3.

FIG. 12 is a cross-sectional view showing an injection path of reaction gases in an apparatus of FIG. 3. As shown in FIG. 12, since the shielding means 140 is pushed up by the substrate S, the hanging part 142 of the shielding means 140 is separated from the bottom surface 133 of the RF electrode 130 and an injection path is generated between the body part 144 and the boundary of the through hole 132. As a result, the reaction gases in the hollow 131 are injected over the edge portion of the substrate S through the injection path between the body part 144 and the boundary of the through hole 132.

At step ST15 of FIG. 10, an RF power is applied to the RF electrode 130 by the RF power source 160 and the susceptor 120 is grounded. Accordingly, the reaction gases are ionized to generate a plasma P between the RF electrode 130 and the susceptor 120. The RF power is determined according to a size of the susceptor 120. For example, the RF power may be within a range of about 100 W to about 50 kW. In addition, the RF power may have a power density of about 100 mW/cm² to about 5 W/cm².

At step ST16 of FIG. 10, the edge portion of the substrate S exposed through the shielding means 140 is etched by the plasma. At steps ST17 and ST18 of FIG. 10, the susceptor 120 moves down and the substrate S is outputted. When an apparatus of FIG. 4 is used for etching the substrate, the tray T having the plurality of substrates S thereon is outputted from the chamber 110.

In an apparatus of FIG. 3, the substrate S contacts and pushes up the shielding means 140 so that the injection path can be generated. However, patterns formed on the substrate S may be deteriorated by the contact between the substrate S and the shielding means 140. The deterioration of the patterns on the substrate S may be prevented in an apparatus for etching a substrate according to another embodiment.

Figure 13:
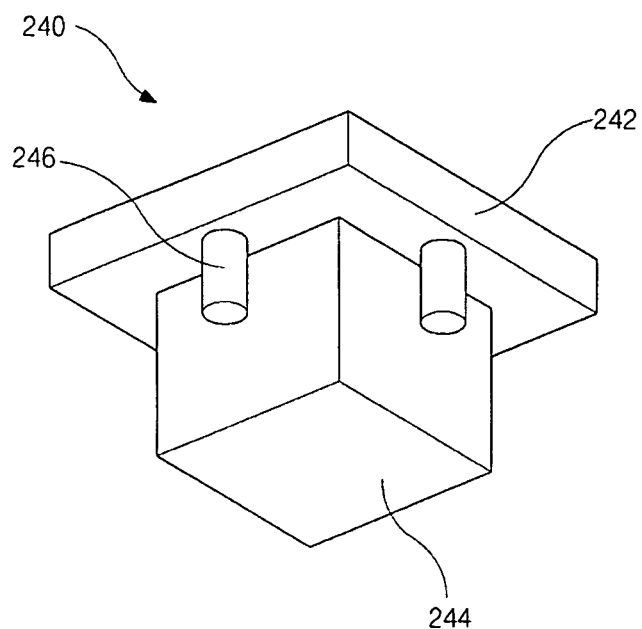
FIGS. 13 and 14 are perspective and cross-sectional views, respectively, showing a shielding means of an apparatus for etching a substrate according to another embodiment of the present invention.
Figure 14:
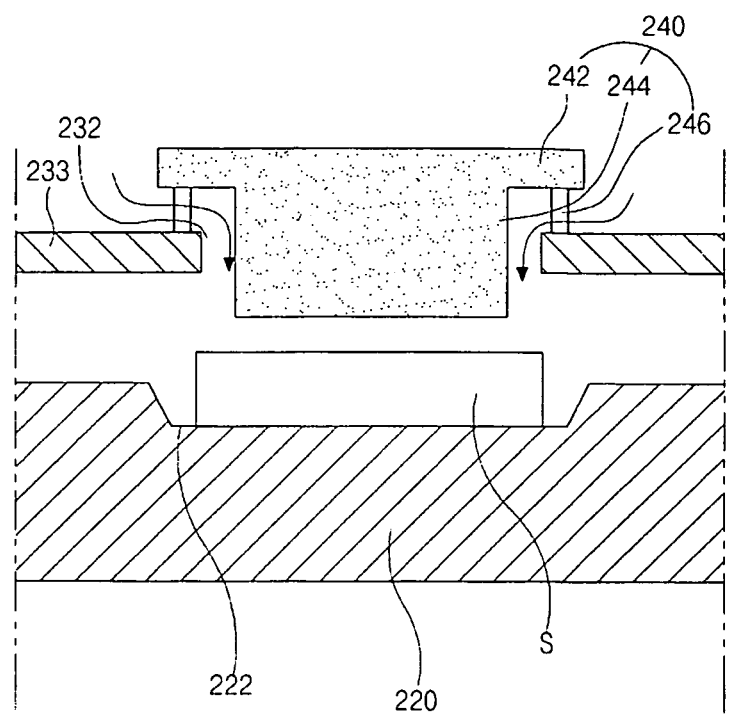

FIGS. 13 and 14 are perspective and cross-sectional views, respectively, showing a shielding means of an apparatus for etching a substrate according to another embodiment of the present invention.

In FIGS. 13 and 14, a shielding means 240 includes a body part 244, a hanging part 242 on the body part 244 and a plurality of supporting parts 246 downwardly protruding from the hanging part 242. Since the shielding means 240 is supported by the plurality of supporting parts 246 contacting a bottom surface 233 of an RF electrode, the hanging part 242 is separated from the bottom surface 233 of the RF electrode and an injection path for reaction gases is generated between the body part 244 and a boundary of a through hole 232. As a result, the injection path is generated without contact of a substrate S and the body part 244. Accordingly, the substrate S is separated by the body part 244 even when a susceptor 220 moves up. For example, when the susceptor 220 has an uppermost position, the separation distance between the substrate S and the body part 244 of the shielding means 240 may be about 1 mm to prevent the penetration of the reaction gases over a central portion of the substrate S.

In an apparatus of FIG. 3, the reaction gases are injected through the plurality of through holes 132 of the RF electrode 130. However, the injection of the reaction gases through the plurality of through holes 132 may be insufficient. The injection of the reaction gases may be improved by additional injection paths in an apparatus for etching a substrate according to another embodiment.

Figure 15:
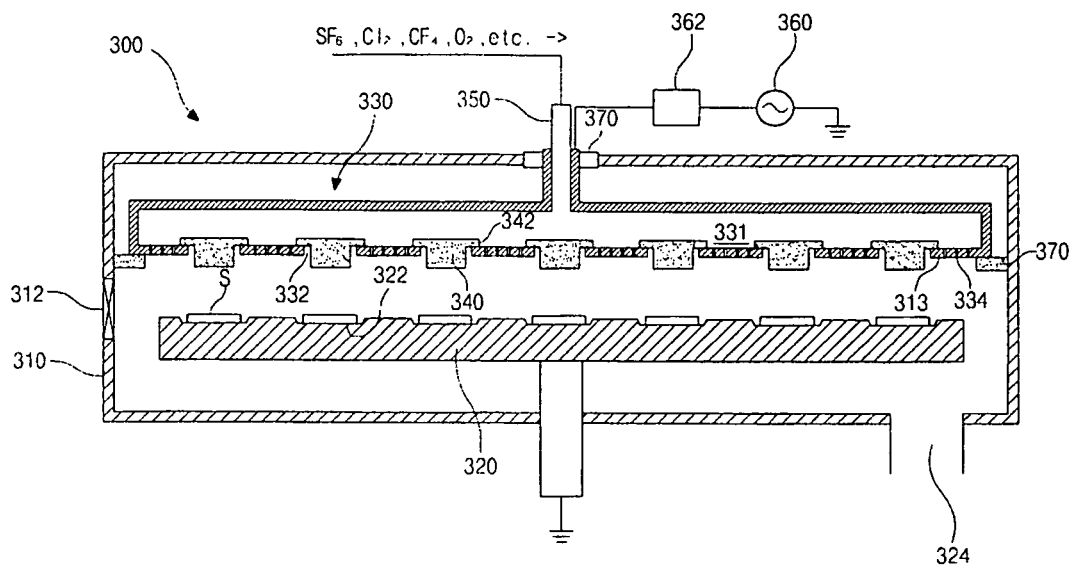
FIGS. 15 and 16 are cross-sectional views showing an apparatus for etching a substrate according to another embodiment of the present invention.
Figure 16:
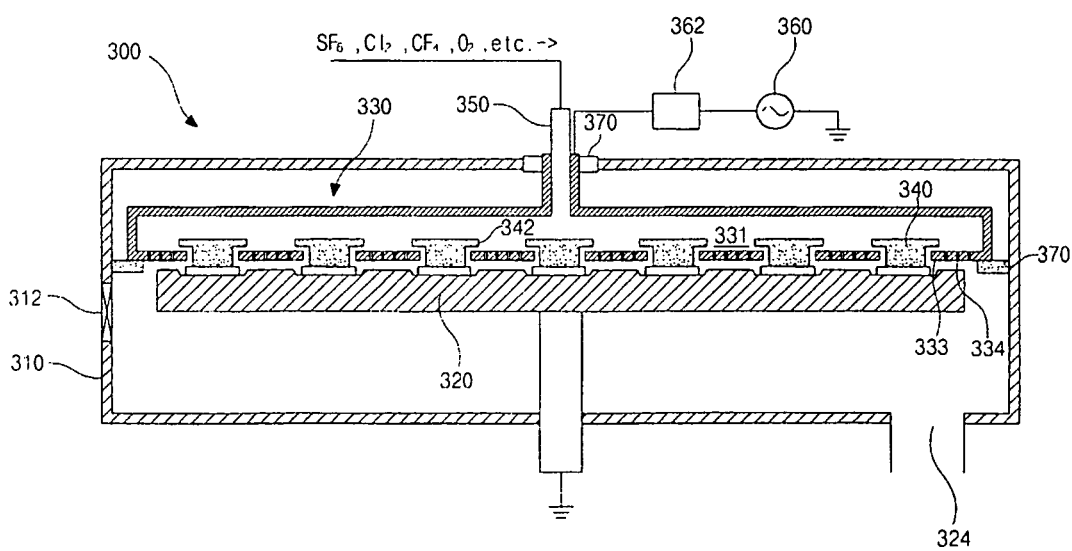

FIGS. 15 and 16 are cross-sectional views showing an apparatus for etching a substrate according to another embodiment of the present invention.

In FIGS. 15 and 16, a plurality of injection holes 334 are formed in a bottom surface 333 between through holes 332 of an RF electrode 330. Accordingly, reaction gases in a hollow 331 of the RF electrode 330 are sufficiently injected over an edge portion of a substrate S through the plurality of through holes 332 and the plurality of injection holes 334 when a susceptor 320 moves up.

In an apparatus of FIG. 3, the reaction gases are consistently injected through the gas inlet 150 and the remaining reaction gases and the etch residues are consistently exhausted through the gas outlet 124 to keep the constant pressure of the chamber 110 during the etch process. However, since the plurality of substrates S on the susceptor 120 contact the plurality of shielding means 140 protruding from the RF electrode 130 during the etch process, the exhaustion of the remaining reaction gases and the etch residues is prevented. In addition, the etch residues moving from a central portion to an edge portion adjacent to the gas outlet 124 may be attached to or be re-deposited on the edge portion of each substrate S. The attached or re-deposited etch residues may function as a contaminant source in a subsequent process.

Figure 17:
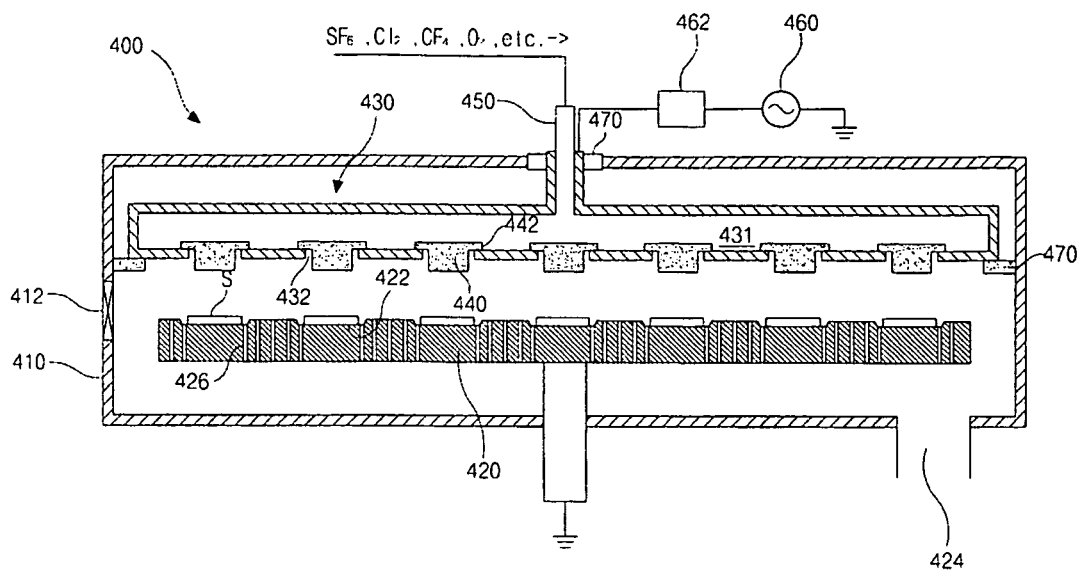
FIG. 17 is a cross-sectional view showing an apparatus for etching a substrate according to another embodiment of the present invention.

FIG. 17 is a cross-sectional view showing an apparatus for etching a substrate according to another embodiment of the present invention.

In FIG. 17, a plurality of exhaust holes 426 are formed in a susceptor 420 between adjacent loading portions 422. Residual reaction gases and etch residues are exhausted directly to a space under the susceptor 420 through the plurality of exhaust holes 426. Accordingly, the residual reaction gases and the etch residues are uniformly exhausted from a chamber 410 through gas outlet 424 even during the etch process. A number of the plurality of exhaust holes 426 and a diameter of each exhaust hole 426 may be determined according to a pressure of the chamber 410 during the etch process.

When a tray having a plurality of substrates thereon is used for the etch process, the tray and the susceptor may have the plurality of first exhaust holes and the plurality of second exhaust holes, respectively. In addition, the tray may be aligned to the susceptor such that the plurality of first exhaust holes exactly face the plurality of second exhaust holes.

Figure 18:
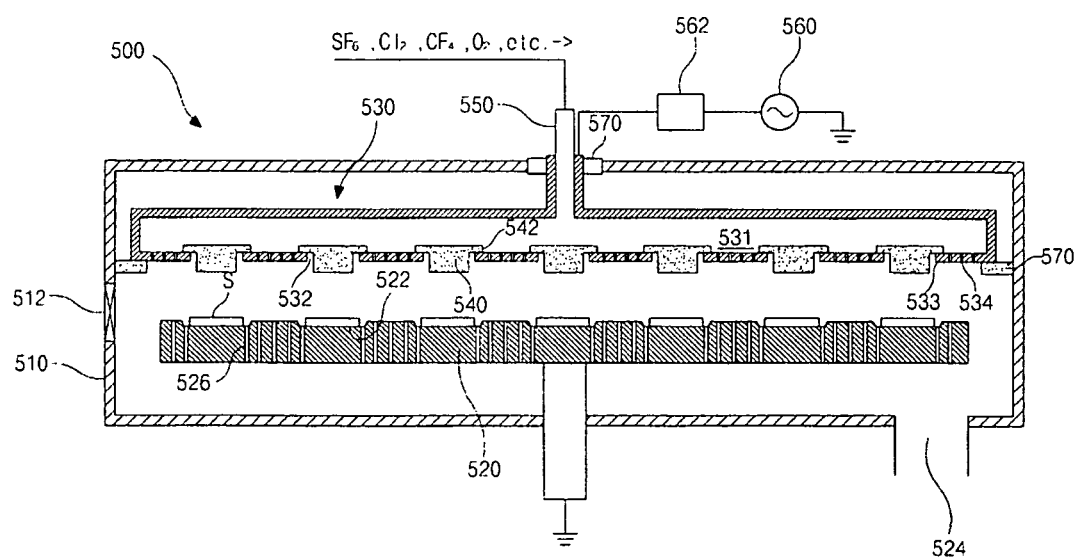
FIG. 18 is a cross-sectional view showing an apparatus for etching a substrate according to another embodiment of the present invention.

FIG. 18 is a cross-sectional view showing an apparatus for etching a substrate according to another embodiment of the present invention.

In FIG. 18, a plurality of exhaust holes 526 are formed in a susceptor 520 between adjacent loading portions 522, and a plurality of injection holes are formed in a bottom surface 533 between through holes 532 of an RF electrode 530. Accordingly, reaction gases in a hollow 531 of the RF electrode 530 are sufficiently infected over an edge portion of a substrate S through the plurality of through holes 532 and the plurality of injection holes 534, and residual reaction gases and etch residues are exhausted directly to a space under the susceptor 520 through the plurality of exhaust holes 526.

In an apparatus of FIG. 3, a thin film pattern on top and side surfaces of the edge portion of the substrate S is removed. In another embodiment, an undesirable thin film pattern on a bottom surface of the edge portion of the substrate S may be removed by an apparatus for etching a substrate.

Figure 19:
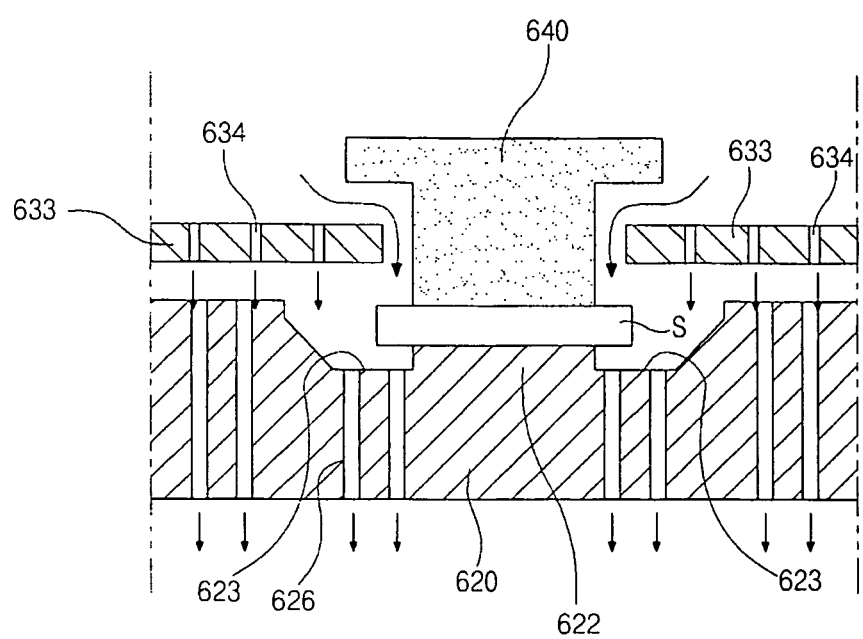
FIG. 19 is a cross-sectional view showing an apparatus for etching a substrate according to another embodiment of the present invention.

FIG. 19 is a cross-sectional view showing an apparatus for etching a substrate according to another embodiment of the present invention.

In FIG. 19, a susceptor 620 includes a plurality of loading portions 622 and a substrates S is loaded on each loading portion 622 of the susceptor 620. In addition, since a trench portion 623 is formed at a boundary of each loading portion 622, each loading portion 622 upwardly protrudes from the trench portion 623. Accordingly, a bottom surface in a central portion of the substrate S contacts each loading portion 622 and the bottom surface in an edge portion of the substrate S is exposed. As a result, top, side and bottom surfaces in the edge portion of the substrate S are exposed to a plasma of reaction gases, a thin film pattern on the top, side and bottom surfaces in the edge portion of the substrate S is removed by the etch process.

In an apparatus of FIG. 3, the RF electrode 130 is connected to the RF power source 160 and the susceptor 120 is grounded. In another embodiment, the connection of the RF electrode and the susceptor may be changed.

Figure 20:
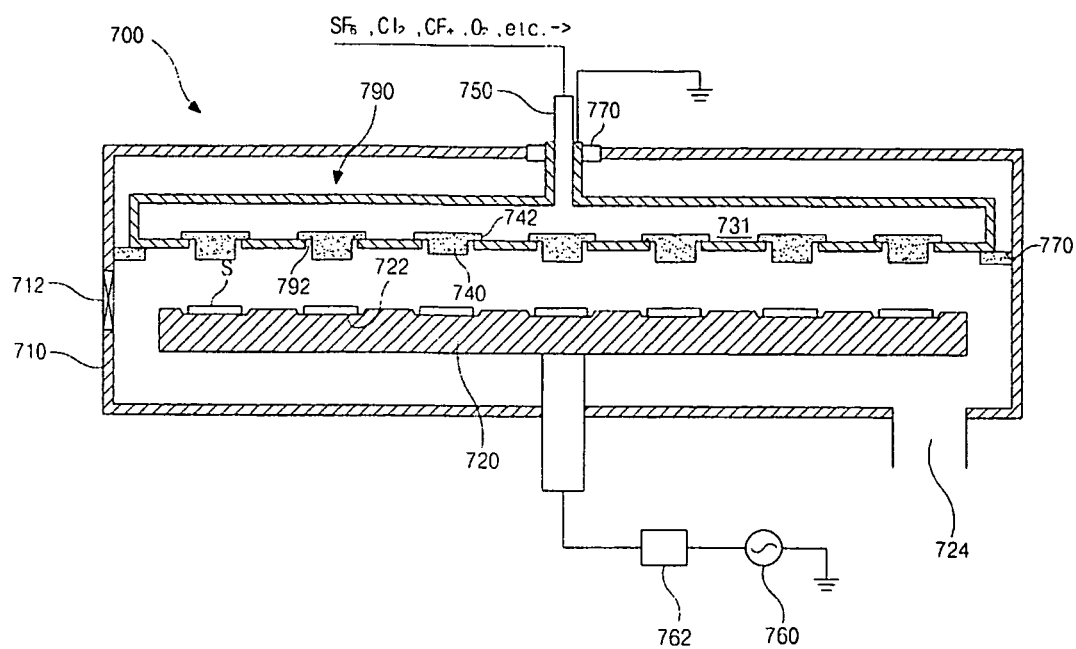
FIGS. 20 and 21 are cross-sectional views of apparatuses for etching a substrate according to another embodiment of the present invention.
Figure 21:
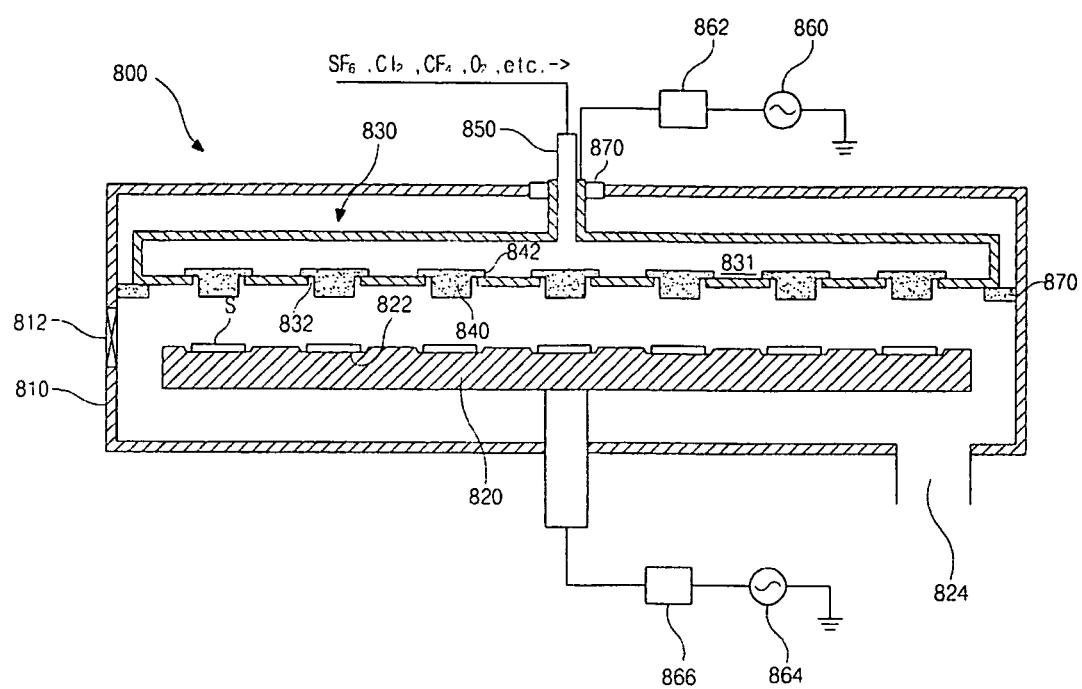

FIGS. 20 and 21 are cross-sectional views of apparatuses for etching a substrate according to another embodiment of the present invention.

In FIG. 20, an apparatus 700 includes a chamber 710, a susceptor 720 and a gas supply 790 disposed over the susceptor 720. The susceptor 720 is connected to an RF power source 760 through a matching circuit 762, and the gas supply 790 is grounded. The gas supply 790 includes a hollow 731 connected to a gas inlet 750 and a plurality of through holes 792 in a bottom surface thereof. In addition, a shielding means 740 is interposed into each through hole 792. Since an RF power is not applied to the gas supply 790, the gas supply 790 may include a material different from a conductive material. The RF power source 760 supplies an RF power having a frequency of about 10 kHz to about 13.56 MHz or an RF power having a frequency of very high frequency (VHF) of about 30 MHz to about 300 MHz.

In FIG. 21, an apparatus 800 includes a chamber 810, a susceptor 820 and an RF electrode 830 disposed over the susceptor 820. The RF electrode 830 is connected to a first RF power source 860 through a first matching circuit 862, and the susceptor 820 is connected to a second RF power source 864 through a second matching circuit 866. Each of the first and second power sources 860 and 864 supplies an RF power having a frequency of about 10 kHz to about 13.56 MHz or an RF power having a frequency of very high frequency (VHF) of about 30 MHz to about 300 MHz.

In an apparatus of FIG. 3, a plasma is generated inside the chamber 110. In another embodiment, a plasma may be generated outside a chamber.

Figure 22:
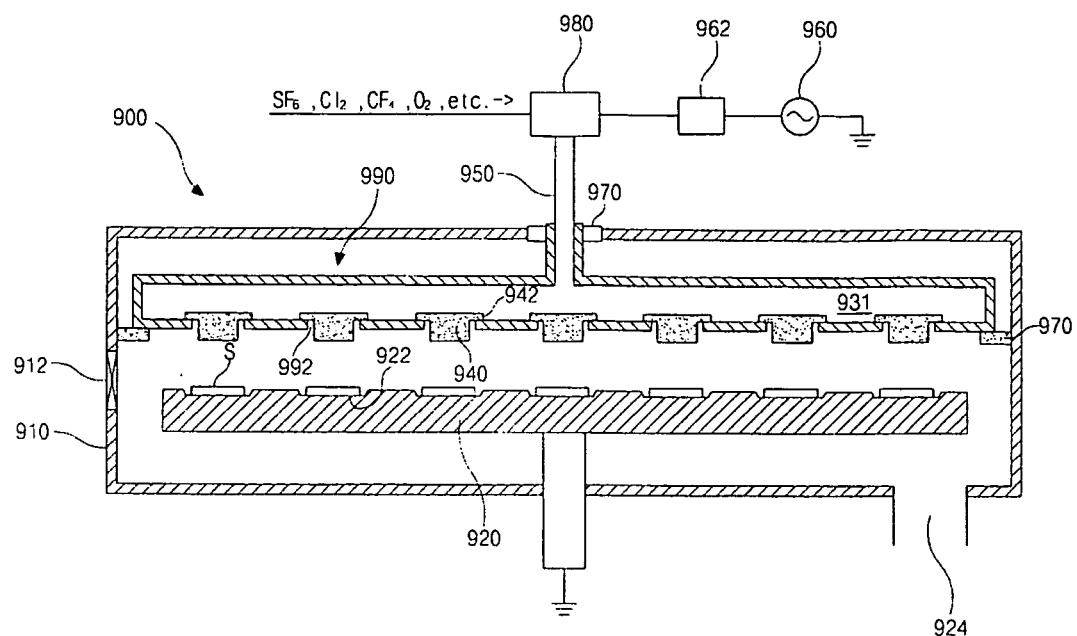
FIG. 22 is a cross-sectional view showing an apparatus for etching a substrate according to another embodiment of the present invention.

FIG. 22 is a cross-sectional view showing an apparatus for etching a substrate according to another embodiment of the present invention.

In FIG. 22, an apparatus 900 includes a chamber 910, a susceptor 920, a gas supply 990 disposed over the susceptor 920 and a remote plasma generator 980. The susceptor 920 and the gas supply 990 are disposed inside the chamber 910, and the remote plasma generator 980 is disposed outside the chamber 910. In addition, the remote plasma generator 980 is connected to an RF power source 960 through a matching circuit 962. Accordingly, a plasma is generated in the remote plasma generator 980 using reaction gases such as sulfur hexafluoride ($SF_6$), chlorine ($Cl_2$), carbon tetrafluoride ($CF_4$) and oxygen ($O_2$) and the plasma is transmitted to the gas supply 990 through a gas inlet 950. Further, the plasma is injected over a substrate S from the gas supply 990. The gas supply 990 includes a hollow 991 connected to the gas inlet 950 and a plurality of through holes 992 in a bottom surface thereof. In addition, a shielding means 940 is interposed into each through hole 992. Since an RF power is not applied to the gas supply 990, the gas supply 990 may include a material different from a conductive material.

It will be apparent to those skilled in the art that various modifications and variations can be made in an apparatus for etching a substrate of the present invention without departing from the spirit or scope of the invention. Thus, it is intended that the present invention cover the modifications and variations of this invention provided they come within the scope of the appended claims and their equivalents.

What is claimed is:

1. An apparatus for etching a substrate, comprising:
a chamber;
a susceptor in the chamber, the susceptor including a plurality of first loading portions corresponding to a plurality of substrates, respectively;
a gas supply over the susceptor, the gas supply including a hollow and a plurality of through holes corresponding to the plurality of first loading portions, respectively; and
a plurality of shielding means interposed into the plurality of through holes, respectively, the plurality of shielding means each including a body part and a hanging part on the body part, the body part having a cross-sectional area smaller than the corresponding through hole, and the hanging part outwardly protruding from the body part,
wherein the shielding means is suspended on the gas supply by the hanging part, and wherein the body part shields a central portion of the corresponding substrate and exposes an edge portion of the corresponding substrate,
wherein each of the shielding means is configured to contact the corresponding substrate and be pushed up by an upward movement of the susceptor so that the hanging part is capable of being separated from the gas supply.

2. The apparatus according to claim 1, wherein each first loading portion includes a concave portion and a slant portion at a boundary of the concave portion.

3. The apparatus according to claim 1, wherein the susceptor further includes at least one exhaust hole.

4. The apparatus according to claim 3, wherein the at least one exhaust hole is disposed adjacent to the first loading portions.

5. The apparatus according to claim 1, wherein the susceptor further includes a trench portion at a boundary of each first loading portion such that a bottom surface in the edge portion of the corresponding substrate is exposed.

6. The apparatus according to claim 1, wherein the plurality of shielding means includes an insulating material.

7. The apparatus according to claim 1, wherein each shielding means further includes at least one supporting part downwardly protruding from the hanging part and contacting a boundary of the corresponding through hole.

8. The apparatus according to claim 1, wherein for each shielding means, the hanging part includes a first alignment means and a boundary of the corresponding through hole includes a second alignment means corresponding to the first alignment means.

9. The apparatus according to claim 8, wherein for each shielding means, the first and second alignment means include an alignment hole and an alignment pin.

10. The apparatus according to claim 1, wherein the gas supply further includes at least one injection hole adjacent to the at least one through hole.

11. The apparatus according to claim 1, wherein the gas supply is connected to a first RF power source.

12. The apparatus according to claim 11, wherein the susceptor is connected to one of a ground and a second RF power source.

13. The apparatus according to claim 1, wherein the gas supply is grounded and the susceptor is connected to an RF power source.

14. The apparatus according to claim 1, further comprising a remote plasma generator connected to the gas supply outside the chamber.

15. The apparatus according to claim 1, further comprising a tray on the susceptor, wherein the tray includes a plurality of second loading portions, each having a concave portion and a slant portion at a boundary of the concave portion, wherein each second loading portion corresponds to one of the first loading portions, and wherein the susceptor has a flat top surface.

16. The apparatus according to claim 15, wherein the tray further includes at least one first exhaust hole adjacent to the second loading portions and the susceptor further includes at least one second exhaust hole corresponding to the at least one first exhaust hole.

\* \* \* \* \*